United States Patent [19]

Suzuki

[11] Patent Number: 5,253,182
[45] Date of Patent: Oct. 12, 1993

[54] METHOD OF AND APPARATUS FOR CONVERTING DESIGN PATTERN DATA TO EXPOSURE DATA

[75] Inventor: Toshio Suzuki, Iruma, Japan

[73] Assignee: Hitachi, Ltd., Tokyo, Japan

[21] Appl. No.: 653,310

[22] Filed: Feb. 11, 1991

[30] Foreign Application Priority Data

Feb. 20, 1990 [JP] Japan .................................. 2-039283

[51] Int. Cl.$^5$ ....................... G06F 15/60; G06F 15/20
[52] U.S. Cl. .................................... 364/489; 364/488; 250/492.3; 250/492.1
[58] Field of Search .................. 364/490, 489, 488; 250/492.1, 492.2, 492.3

[56] References Cited

U.S. PATENT DOCUMENTS

| | | | |
|---|---|---|---|
| 4,482,810 | 11/1984 | Cooke | 364/490 |
| 4,812,962 | 3/1989 | Witt | 364/490 |
| 4,878,177 | 10/1989 | Ikenaga et al. | 364/490 |
| 4,950,910 | 8/1990 | Yasuda et al. | 364/490 |
| 5,008,830 | 4/1991 | Moriizumi et al. | 364/490 |
| 5,079,717 | 1/1992 | Miwa | 364/490 |

FOREIGN PATENT DOCUMENTS

122529 7/1982 Japan .

OTHER PUBLICATIONS

"Electron-Beam Direct Wiring Technology" by Murai et al., Proceedings of IEDM, Dec. 1983, pp. 558–561.
"A Concurrent Pattern Operation Algorithm for VLSI Mask data" by Kozawa et al, IEEE 18th DAC, Jun. 1981, pp. 563–570.

Primary Examiner—Vincent N. Trans
Attorney, Agent, or Firm—Fay, Sharpe, Beall, Fagan, Minnich & McKee

[57] ABSTRACT

A method and apparatus for converting design pattern data for a semiconductor integrated circuit device to an exposure data for use in an exposure apparatus. The pattern data includes a repetition data section corresponding to the repetition section and defining one or more repetitive pattern segments for the unit cells with an overlap between adjacent ones of repetitive pattern segments and a non-repetition data section corresponding to the non-repetition section. Repetition information specifying the repetitive pattern segment is first produced from the design pattern data, and a pattern segment repetition frame is determined on the basis of the repetition information. The pattern segment repetition frame defines a unit region selected from the repetitive pattern segment. A repetitive arrangement of the unit region without any overlap is equivalent to at least a portion of the repetition section. Data for one of the unit cells and those of unit cells which are adjacent the one unit cell are selected and developed on the basis of the repetition information and are pattern-processed to produce processed repetitive pattern segment data and that portion of the processed repetitive pattern segment data which lies within the pattern segment repetition frame is extracted to form a fundamental pattern segment data. The fundamental pattern segment data is repetitively used for drawing the repetition section.

12 Claims, 12 Drawing Sheets

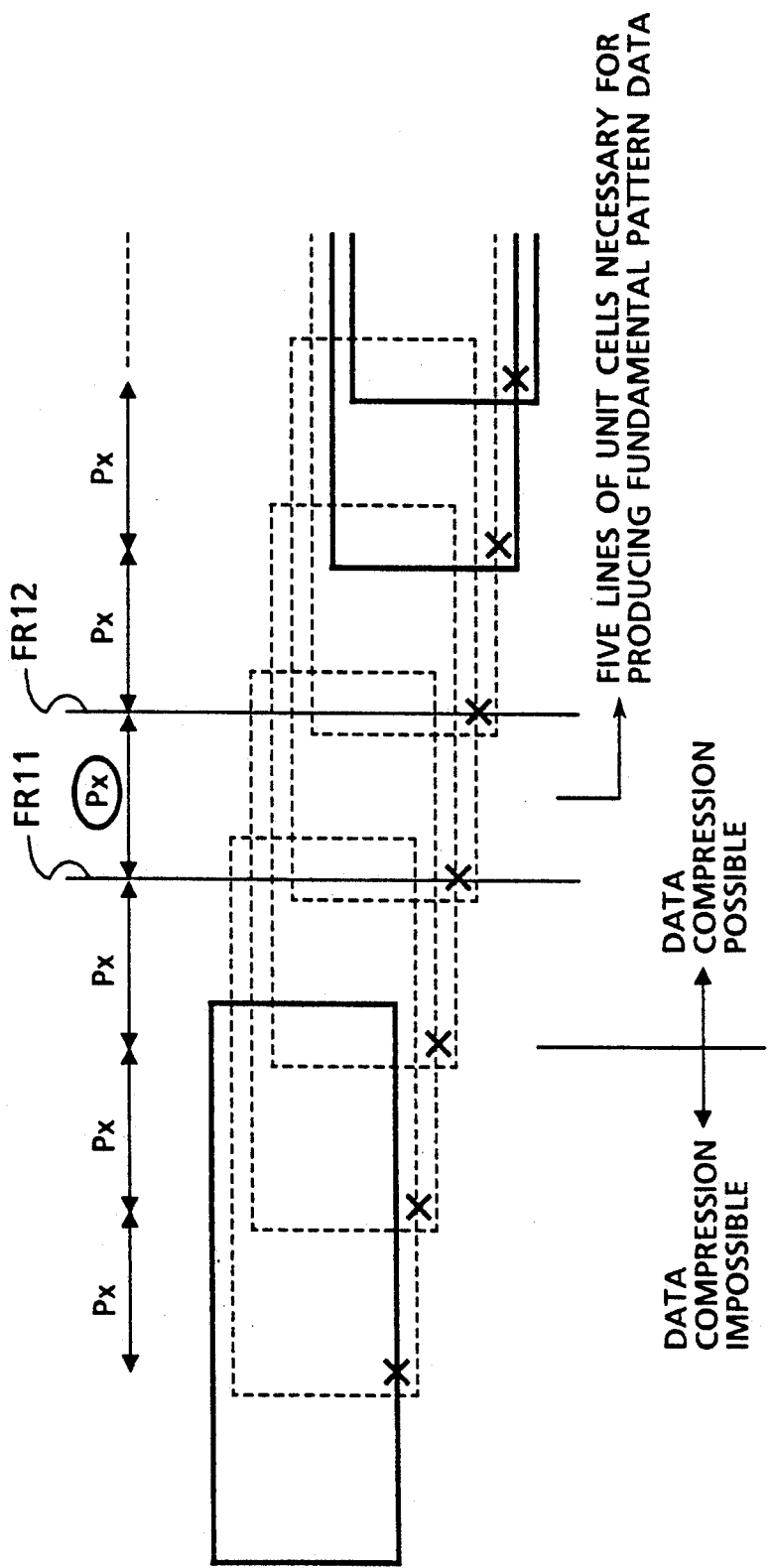

METHOD OF AND APPARATUS FOR CONVERTING DESIGN PATTERN DATA TO EXPOSURE DATA

BACKGROUND OF THE INVENTION

The present invention relates to production of exposure data for an exposure apparatus from circuit design pattern data for a semiconductor integrated circuit and the like, and more particularly to a technique for compressing design pattern data, and for example, to exposure data production for a semiconductor device and the like including many repetitive pattern segments such as a semiconductor memory device.

As semiconductor integrated circuits become large in scale and microscopic in circuit patterns, a technique for drawing patterns on a mask or a wafer by utilizing an electron beam exposure apparatus has been adopted. In order to draw a predetermined pattern on a mask or a wafer with an electron beam exposure apparatus by using design pattern data for LSI devices prepared through logic design, circuit design and layout design, such pattern data will have to be converted to exposure data for an electron beam exposure apparatus. Such conversion is performed for the purpose of: overlap removal so that exposure accuracy is not lowered by multiple exposure due to overlap between pattern elements in a pattern defined by design pattern data; size correction in case it is desired to enlarge or reduce pattern elements defined by pattern data; proximity effect correction against scattering of an electron beam in pattern drawing; processing of decomposing patterns into fundamental pattern elements which are able to be drawn with an electron beam exposure apparatus; and so forth. The data conversion described above is usually performed with a large computer.

Recently, the amount of data to be processed by an electron beam exposure apparatus goes on increasing as an LSI device becomes large in scale and microscopic in circuit pattern. In the conventional electron beam exposure technique, conversion of a design pattern data to an exposure data has been made one by one on all the pattern elements defined by the design pattern data to be converted. Therefore, computer processing time required for the data conversion and exposure data amount are increased, and efficient conversion to exposure data has not been possible with a highly integrated LSI device such as a DRAM.

Thus, a technique which performs compression of exposure data has been proposed for the purpose of reducing the exposure data amount. JP-A-57-122529 (laid-open on Jul. 30, 1982) may be mentioned as an example in which such a technique is described. According to this publication, repetitive patterns defined by an exposure data for the whole of a pattern having been converted from a design pattern data are recognized, and pattern segments representing all regions including identical repetitive pattern segment are entered and utilized repeatedly for corresponding regions, thereby to compress the amount of data necessary in practical pattern drawing.

SUMMARY OF THE INVENTION

In the conventional technique, however, data compression is performed after all of the pattern elements recognized from a design pattern data are converted once into an exposure data. Therefore, computer processing time for eventually producing an exposure data to be utilized for a pattern drawing is not reduced. Further, it has been found by the present inventor that, when this data compression technique is applied directly to compression of a design pattern data, inconveniences such as undesirable pattern missing or discontinuity and/or undesirable overlap take place in a pattern defined by an exposure data obtained by data conversion of such data-compressed design pattern data. Namely, since an exposure data defines a collection or a combination of pattern elements in which no overlap exists to thereby prevent double exposure, repetitive pattern segments to be data-compressed are to be treated as those having no overlap between adjacent pattern segments. On the other hand, in a design pattern data, a pattern element which is a unit of repetition has an overlap on an adjacent pattern element in view of the fact that enlargement/reduction of a pattern element may be effected and a pattern may be generally defined as combination of rectangular pattern elements.

Consequently, the present inventor has found out the necessity of direct data compression by recognizing a repetitive pattern segment defined by a design pattern data or a pattern segment which is repeated twice or more and is defined by the design pattern data, taking an overlap of pattern elements into consideration.

It is an object of the present invention to provide a method of and an apparatus for efficiently producing an exposure data from a design pattern data in which data compression is effected, taking into consideration an overlap between a repetitive pattern segment and an adjacent pattern element defined in the design pattern data and/or a pattern segment repeated twice or more and an adjacent pattern element defined in the pattern data.

It is another object of the present invention to provide a method of and an apparatus for producing an exposure data in which time for the data production is reduced and/or exposure data amount is reduced.

A pattern to be drawn usually includes a repetition section divided into regularly arranged unit cells and non-repetition section adjoining to the repetition section. A design pattern data includes a repetition data section corresponding to the repetition section and defining one or more repetitive pattern segments for the unit cells with an overlap between adjacent ones of repetitive pattern segments and a non-repetition data section corresponding to the non-repetition section. In one aspect of the present invention, repetition information specifying the repetitive pattern segment is first produced from the design pattern data, and a pattern segment repetition frame is determined on the basis of the repetition information. The pattern segment repetition frame defines a unit region selected from the repetitive pattern segment. A repetitive arrangement of the unit region without any overlap is equivalent to at least a portion of the repetition section. A to-be-processed repetitive pattern segment data is produced by selecting data for one of the unit cells and those of unit cells which are adjacent the one unit cell and developing the data for the one and adjacent unit cells on the basis of the repetition information. The to-be-processed repetitive pattern segment data and the non-repetition data section are subjected to a pattern processing operation to produce processed repetitive pattern segment data and a processed non-repetition data section and that portion of the processed repetitive pattern segment data which lies within the pattern segment repetition frame is extracted to form a fundamental pattern segment data. The fundamental pattern segment data is repetitively used for drawing the repetition section.

The repetitive pattern segments recognized from a design pattern data are partially overlapped with adjacent pattern elements. Since pattern-processing for magnification change, mirror inversion/rotation, overlap removal, pattern correction and the like may be performed on the repetitive pattern segments, it is desirable to produce a fundamental pattern segment data by developing a data for a repetitive pattern segment along with data for additional repetitive pattern segments around the first-mentioned repetitive pattern segment. The additional repetitive pattern segments are determined depending on the degree of overlap between repetitive pattern segments. Meanwhile, for that portion of the repetition section specified by the repetitive pattern segment data which portion adjoins to the non-repetition section of a pattern, it is required to produce data for an outer peripheral portion of the repetition section by keeping individual regularity with respect to the non-repetition section of the pattern.

In another aspect of the present invention, for a non-repetition section or an outer peripheral portion of the repetition section adjacent the non-repetition section, the non-repetition section and the repetition section being recognized from a circuit design pattern data, identical pattern segments are determined on the basis of the design pattern data or on the basis of the design pattern data and other designated information (e.g., criteria information for determining whether a data be compressed or not), positional information or allocation information which defines regions including the identical pattern segments is determined, and a locally existing fundamental pattern segment data for one unit region including the identical pattern segment is produced with the regular continuity maintained with surrounding pattern elements, and then, exposure data corresponding to the identical pattern segment is produced on the basis of the above-mentioned locally existing fundamental pattern segment data and the positional or allocation information. As a result, it becomes possible to compress design pattern data also for the non-repetition section or the outer peripheral portion of the repetition section adjacent the non-repetition section, thus making it possible to eliminate the necessity of producing exposure data for all of the pattern elements included in the above-mentioned section or portion.

Moreover, in producing an exposure data corresponding to the above-mentioned repetition section, it is possible to include processings to perform removal of an overlap between pattern elements included in the fundamental pattern segment, pattern correction and so forth, while maintaining the regularity between mutual pattern segments included in the repetition section.

Mask patterns are drawn on a mask or on a wafer in accordance with the exposure data obtained in the above-mentioned manner to form a semiconductor integrated circuit device.

In an embodiment of the present invention, regularity contained in the design pattern data is recognized to generate a repetitive pattern segment or an identical pattern segment repeated. Fundamental pattern segment data for one of the unit regions which are defined without an overlap between adjacent unit regions in consideration of overlap removal between pattern elements and pattern correction is produced on the basis of the repetitive pattern segment. Thus, data conversion processing to exposure data for an exposure apparatus should be effected on the basis of the fundamental pattern segment data and its repetition information with the overlap removal and pattern correction for preventing double exposure. Thus, the conventional sequential conversion processing to exposure data for all the pattern elements included in design pattern data is not required. Consequently, reduction in processing time for producing an exposure data is achieved, and further, reduction of the exposure data amount is also achieved by data compression by repetitive expression of exposure data corresponding to the fundamental pattern segments.

BRIEF DESCRIPTION OF THE DRAWINGS

FIGS. 11A and 11B are views showing another embodiment of the present invention.

DESCRIPTION OF THE PREFERRED EMBODIMENTS

Figure 1:
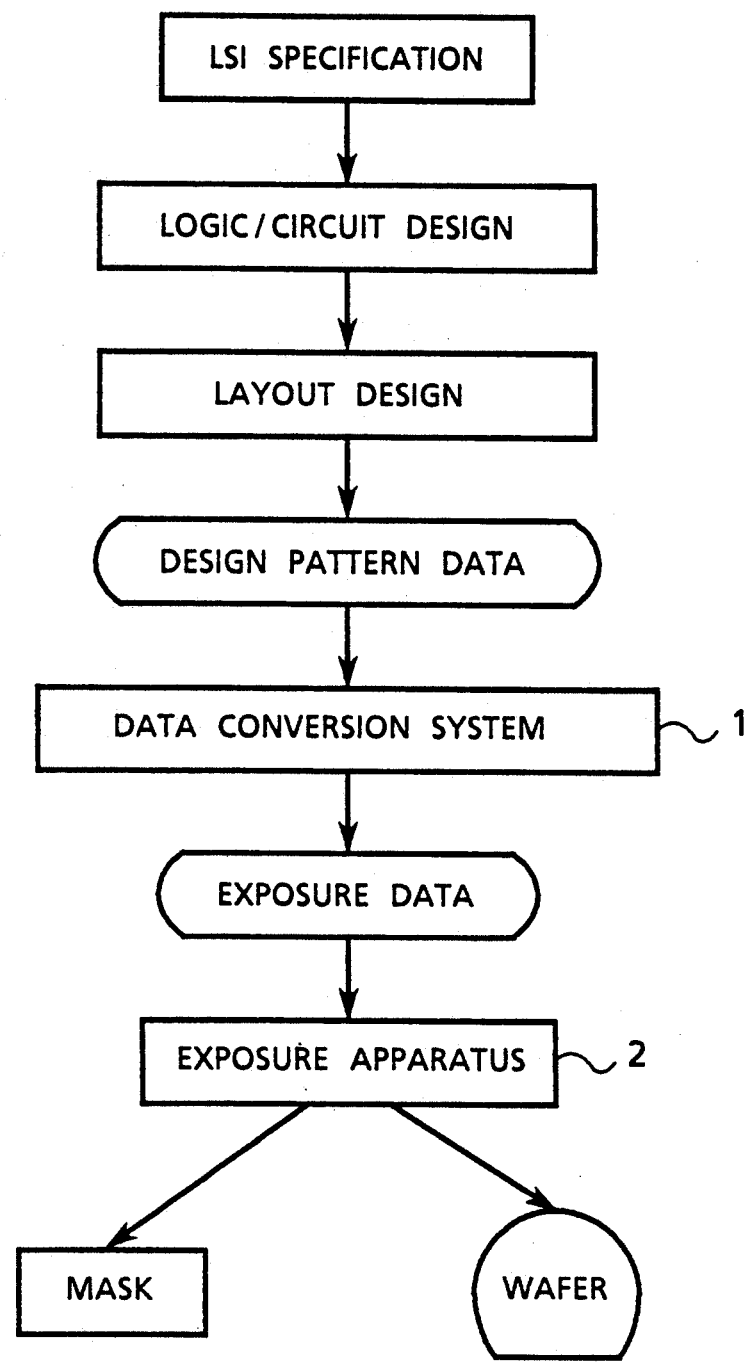
FIG. 1 is a flow chart of an example showing a series of processing steps from development to manufacturing of an LSI device.

First, the situation of the present invention in a development and manufacturing process of a semi-conductor integrated circuit device will be explained with reference to FIG. 1.

A semiconductor integrated circuit device is developed in such a manner that logical design, circuit design and so forth are performed after specifications are determined and layout design is performed based on the specifications. With this, design pattern data required for the semiconductor integrated circuit device are acquired. When a semiconductor integrated circuit device is manufactured based on the design pattern data, the data are given to an exposure data conversion system 1, thereby to convert the data into electron beam exposure data. Then, patterns are drawn on a mask or a wafer with an exposure apparatus (e.g. an electron beam exposure apparatus) 2 based on the exposure data, and a desired semiconductor integrated circuit device is formed through a predetermined manufacturing process by utilizing various mask patterns formed in such a manner. The electron beam exposure data producing system according to the present invention is reflected in an electron beam exposure data conversion system 1.

Figure 2:
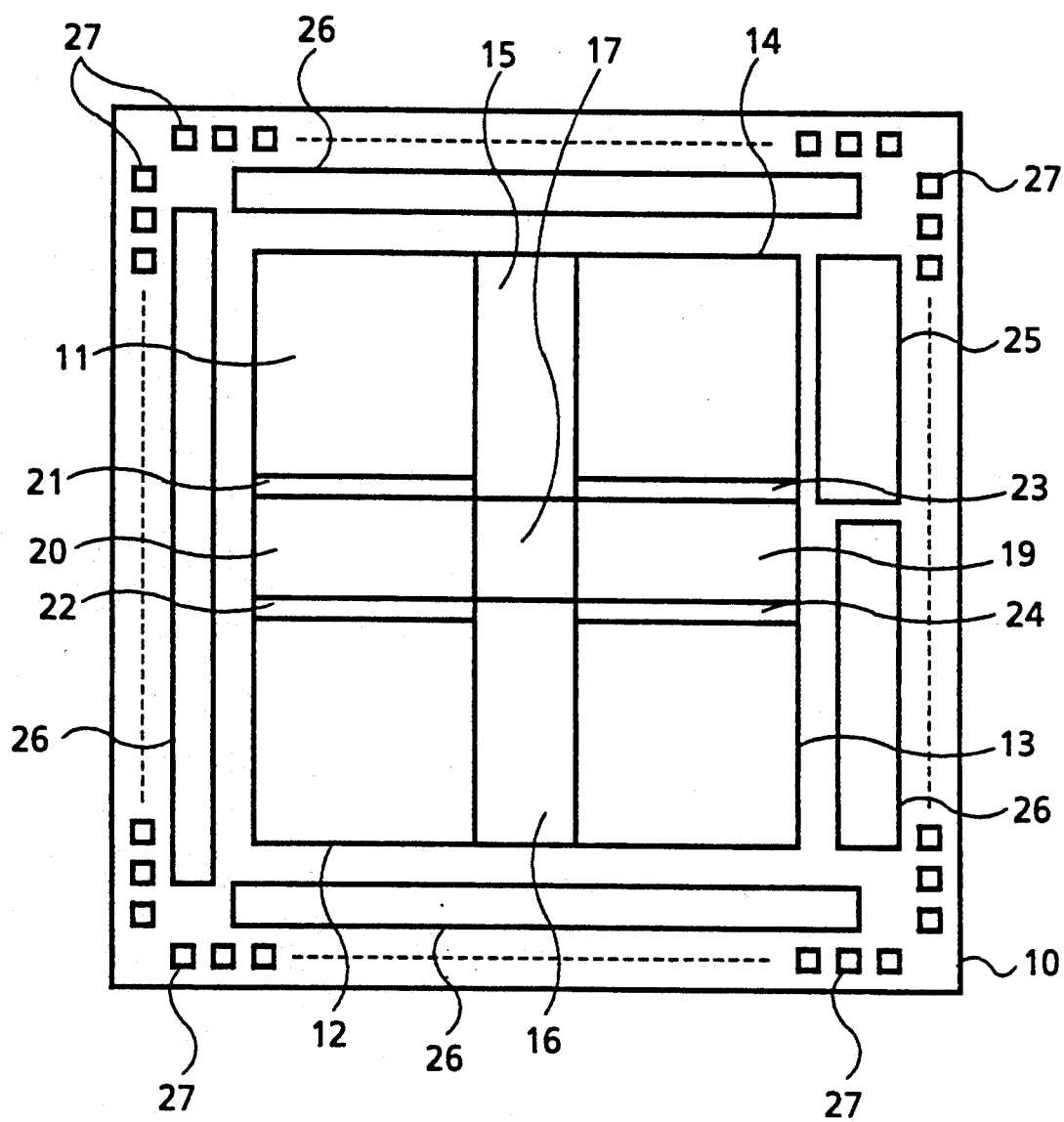
FIG. 2 is a plan view of an example of a semi-conductor integrated circuit device to which the present invention is applicable.

For example, an example of a semiconductor integrated circuit device formed with the above-mentioned technique is shown in a chip plan view of FIG. 2. The semiconductor integrated circuit device shown in FIG. 2 includes a plurality of repetitive pattern segments and may be a semiconductor memory device such as a DRAM or a mask ROM.

The semiconductor integrated circuit device has a semiconductor substrate 10 made of silicon or the like, on which there are provided at its central portion four memory cell arrays 11 to 14, row address decoders 15 and 16 and a column address decoder 17 for addressing memory cells included in those memory cell arrays, column selecting circuits 19 and 20 for connecting bit lines of addressed memory cells with common data lines and so on, sense amplifier arrays 21 to 24 which amplify information read out to the bit lines, a timing signal generator 25 which generates an internal timing signal and there are further provided at a peripheral portion of the substrate surface a plurality of buffer circuits 26 which exchange data, address signals and so on with the outside, these buffer circuits and so forth being connected to bonding pads 27.

Figure 3:
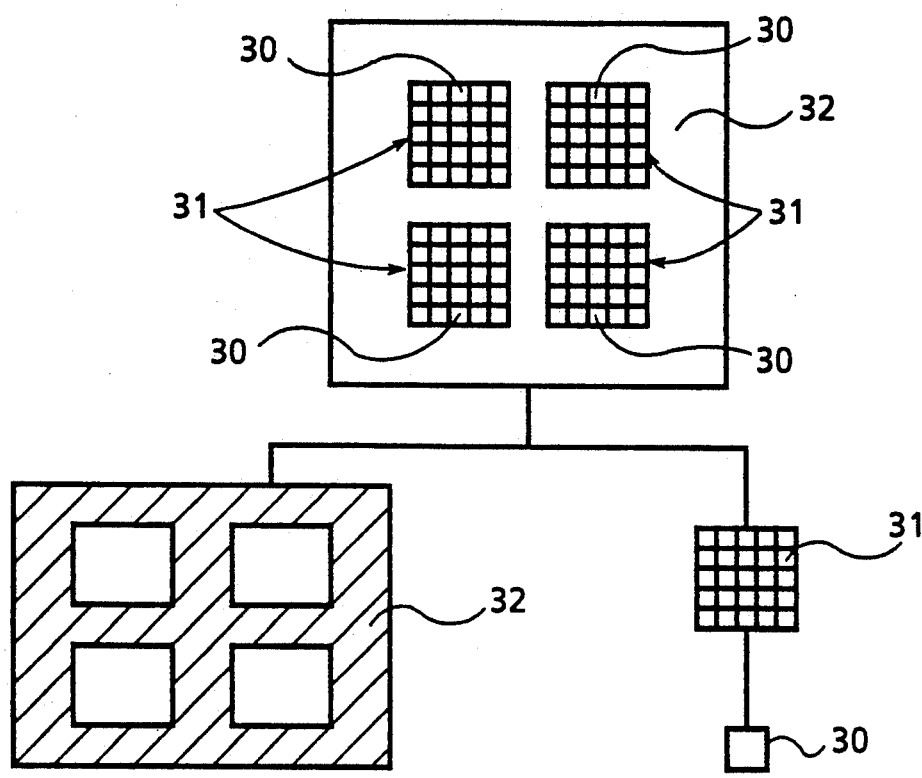
FIG. 3 is an explanatory view showing an example of a hierarchical structure of design pattern data.

A design pattern data for such memory device has a hierarchical structure as shown in FIG. 3. This hierarchical structure includes an array data section (a repetition data section) 31 for an array section (a repetition section) and a non-repetition data section 32 for a non-repetition section. The array data section 31 defines memory cell arrays each including a regular arrangement (e.g., a two-dimensional arrangement at identical intervals) of memory cells. Each of the memory cells is defined by a data cell 30 which constitutes a unit for the array data section 31 and defines a repetitive pattern segment. The array data section 31 in the design pattern data is what should be subjected to data compression. For a correspondency between FIGS. 2 and 3, the data cell 30 which is a unit of repetition described above defines the memory cells (hereafter generally referred to as "unit cells"), the array data section 31 corresponds to memory cell arrays (hereafter generally referred to as "repetition section") 11 to 14.

Figure 4:
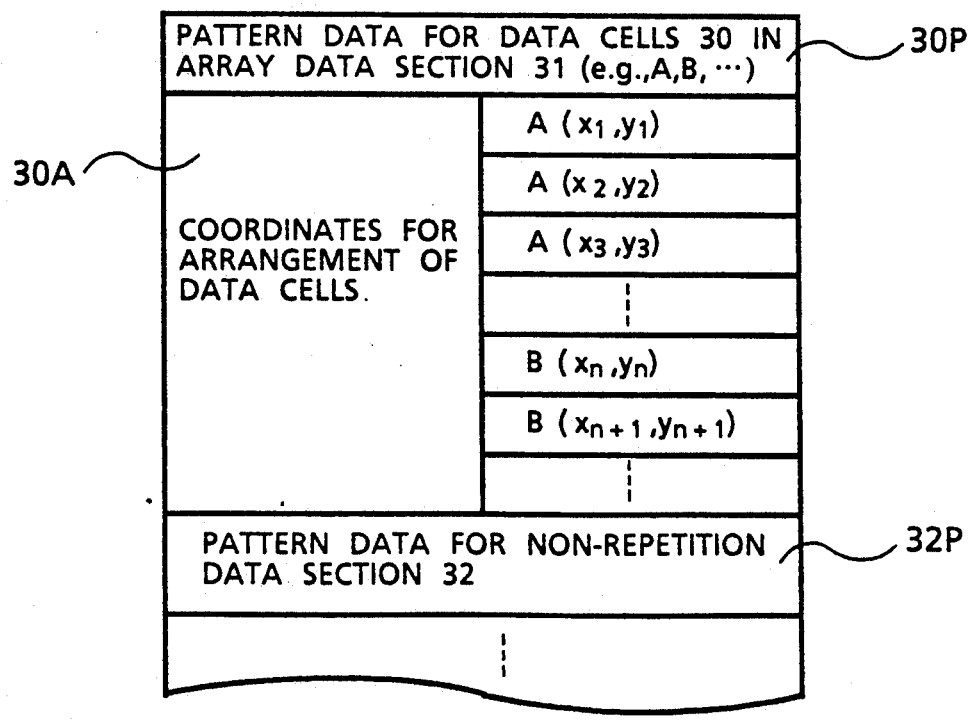
FIG. 4 shows an example of a data format of a design pattern data.

A design pattern data for a mask pattern which is used for manufacturing a semiconductor IC device shown in FIG. 2 includes, for example, a pattern data 30P of data cells 30 constituting the array section 31, coordinates (for example, coordinates within associated array data sections) 30A of respective unit cells defined by data cells 30 on the chip, and a pattern data 32P of the non-repetition data section 32, as shown in FIG. 4. Furthermore, in FIG. 4, the data 30P may include coordinates of respective array sub-sections on the chip defined by the array data section 31 while the data 32P may include coordinates of the non-repetition section on the chip defined by the non-repetition data section 32.

Figure 5:
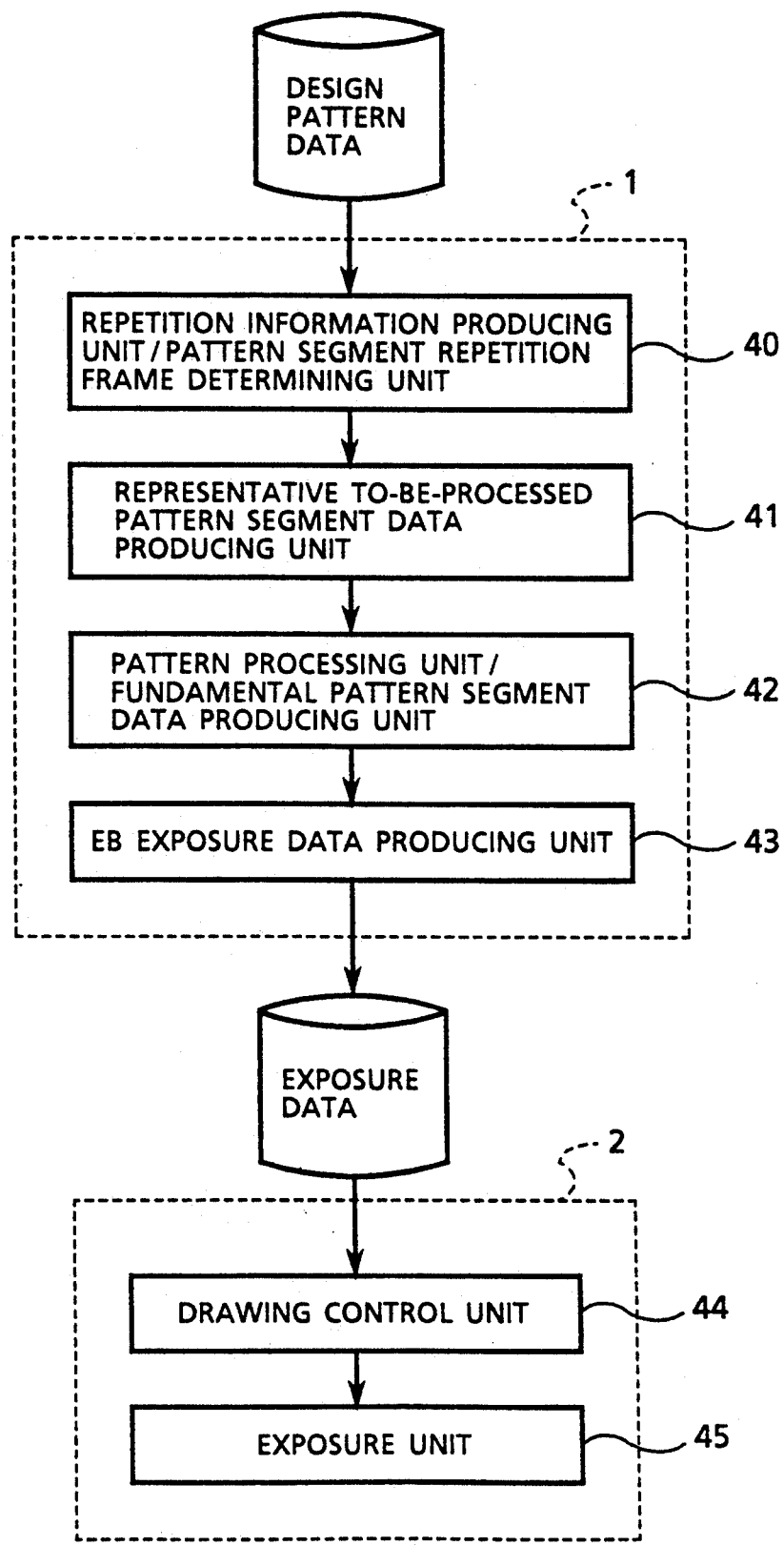
FIG. 5 is a block diagram showing an example of an electron beam exposure data conversion system according to an embodiment of the present invention.

Referring to FIG. 5, an electron beam exposure data conversion system 1 in which a design pattern data is converted to an electron beam exposure data for the electron beam exposure apparatus 2 includes a repetition information producing unit/pattern segment repetition frame determining unit 40 for receiving a design pattern data, producing repetition information concerning that portion of the design pattern which defines a repetitive pattern segment and determining a pattern segment repetition frame; a representative to-be-processed pattern data producing unit 41 for producing a representative pattern data to be subjected to a process such as overlap removal, size correction, etc., on the basis of an output of the unit 40; a pattern processing unit/fundamental pattern segment data producing unit 42 for performing overlap removal between adjacent pattern elements, predetermined size correction, proximity correction etc. and for producing fundamental pattern segment data, in response to an output of the unit 41; and an electron beam exposure data producing unit 43 for performing decomposition of patterns defined by the resulting data from the unit 42 into exposure pattern units for pattern drawing. The data obtained from the unit 43, i.e., an exposure data, is given to an exposure control portion 44 of the electron beam exposure apparatus 2, and an exposure portion 45 draws a pattern on a mask or a wafer in accordance with the control thereof as shown in FIG. 5, for instance.

In the next place, an example of production of an exposure data with the above-mentioned system 1 will be explained in accordance with processings in respective function realizing means shown in FIG. 5, i.e., ① repetition information producing unit/pattern segment repetition frame determining unit 40, ② representative to-be-processed pattern data producing unit 41, ③ pattern processing unit/fundamental pattern segment data producing unit 42 and ④ EB exposure data producing unit 43.

Figure 6:
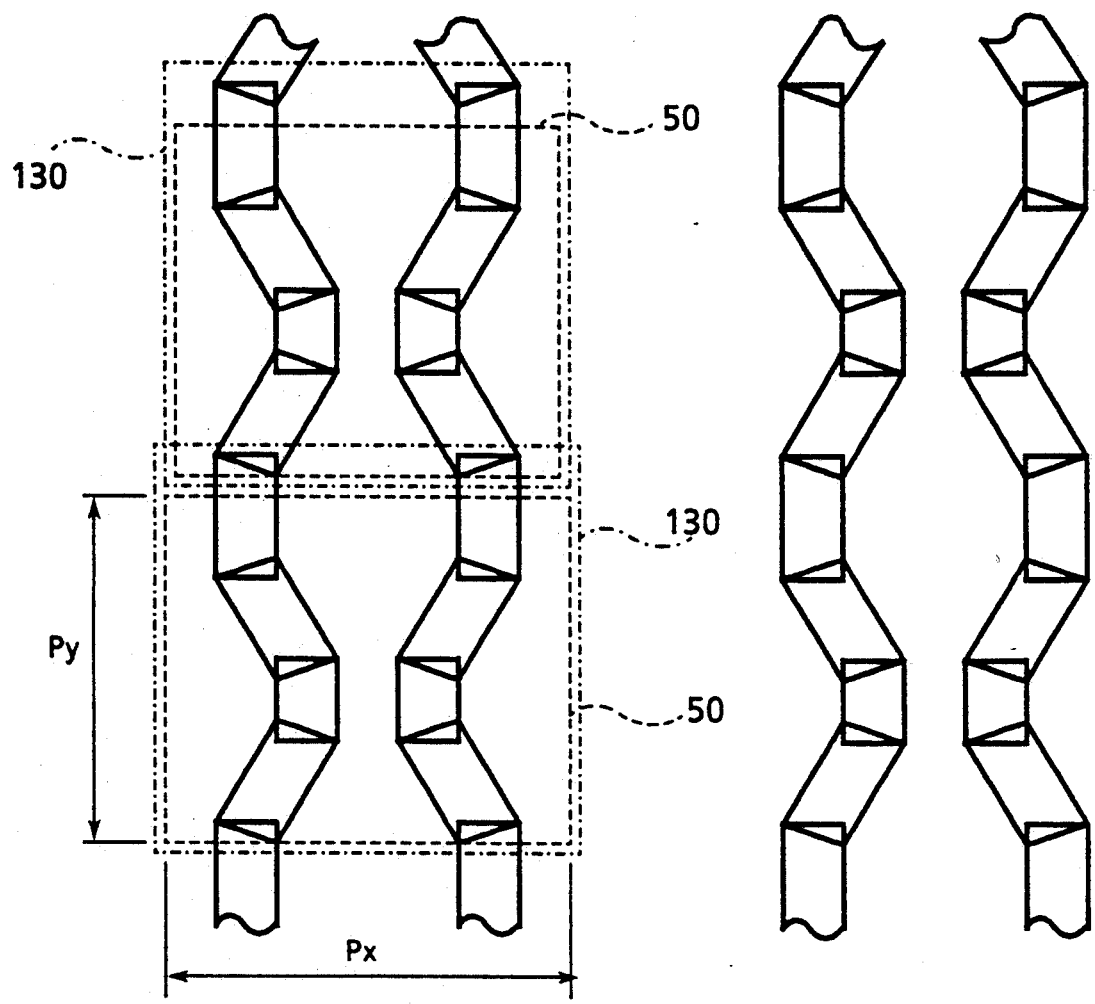
FIG. 6 is a plan view showing an example of a connection state of repetitive pattern segments.

In a design pattern data supplied to the system 1, a repetitive pattern segment included in a unit cell defined by each data cell 30 constituting the array data section is, in practice, partially overlapped with a repetitive pattern segment included in an adjacent unit cell or with a pattern element included in an adjacent non-repetition section so as to be connected with each other. For example, in FIG. 6 showing a pattern defined by a design pattern data for a polysilicon gate included in a memory cell array, respective regions surrounded by two-dot chain lines constitute memory cells 130 (corresponding to data cells in a design pattern data) are partially overlapped with each other and the repetitive pattern segment in each of the memory cells 130 includes a plurality of rectangular pattern elements. For adjacent memory cells 130, parts of rectangular pattern elements which serve to connect the adjacent repetitive pattern segments are partially overlapped with another. Such overlap of pattern elements is provided for the purpose of assuring connection of repetitive pattern segments included in adjacent memory cells or unit cells even when magnification of the cells were changed.

① Repetition information producing unit/pattern segment repetition frame producing unit When a design pattern data including information which specifies unit cells are received, repetition information is produced indicating whether or not the design pattern data includes two or more data cells defining identical pattern segments and, if so, how they (repetitive pattern segments) are arranged. The repetition information may include any other information for specifying the repetitive pattern segments. Referring to FIG. 4 showing an information format, the repetition information may be produced from a pattern data 30P for data cells and coordinates 30A for the unit cells.

Figure 8:
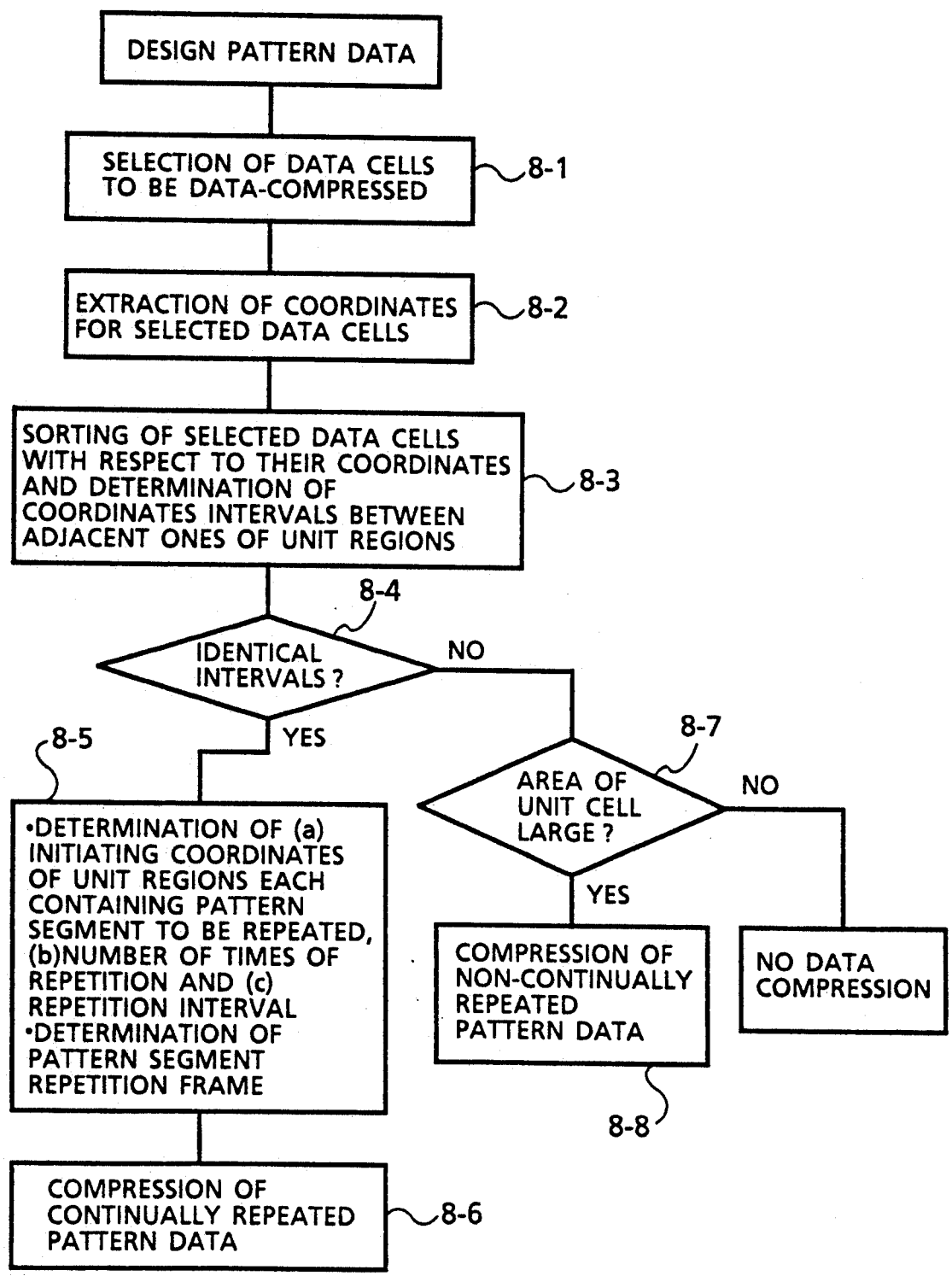
FIG. 8 is a flow chart showing an example of steps for producing repetition information/determining a pattern segment repetition frame.

An example of a process for producing a repetition information will next be described with reference to FIG. 8. First, a given design pattern data is searched to select data cells defining identical pattern segments (8-1). Subsequently, coordinates for data cells defining identical pattern segments are determined or extracted for each of the identical pattern segments (8-2). The extracted data cells are sorted with respect to their coordinates (ordinate and abscissa) and coordinates intervals between adjacent ones of regions (referred to as unit regins) containing the identical pattern segments are determined (8-3). It is judged as to whether or not the determined coordinates intervals are identical with one another (8-4). If the intervals are identical, it means that the identical pattern is continually repeated. Thus, initiating coordinates of unit regions each containing a pattern segment to be repeated, the number of times of repetition and repetition interval are determined on the basis of the information obtained in steps 8-2 and 8-3 (8-5). Thereafter, the continually repeated pattern data are compressed. Meanwhile, in step 8-4, if the intervals of adjacent unit regions are not identical with one another, i.e., if the intervals are not constant, it is judged as to whether or not the area of each of the unit regions containing identical pattern segments is larger than a predetermined value (optionally set) (8-7). If the area is larger than the predetermined value, non-continually repeated pattern data are compressed (8-8). Meanwhile, in step 8-7, if the area is not larger than the predetermined value, data compression is not effected.

Figure 7:
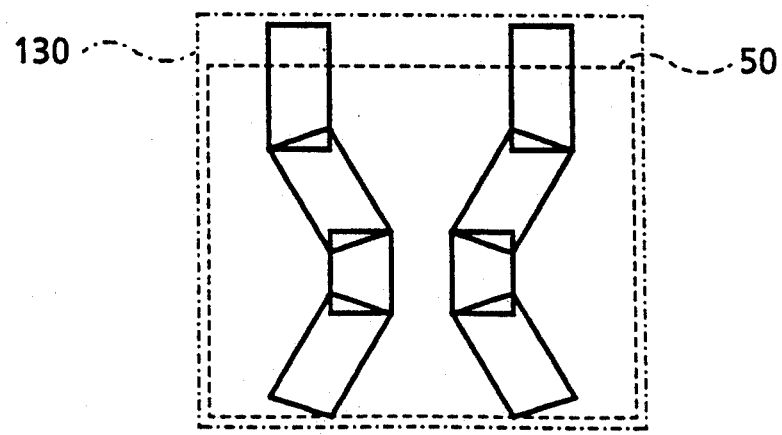
FIG. 7 is a plan view showing an example of a unit region defined by a pattern segment repetition frame for the repetitive pattern segments shown in FIG. 6.

Thus, the repetition information is information for defining a plurality of unit regions in a region including a plurality of repetitive pattern segments defined in a design pattern data. Each of the unit regions includes a substantial part of one repetitive pattern segment except a portion of the pattern element at its peripheral end and does not overlap with an adjacent repetitive pattern segment. The repetition information may include initiating coordinates of the unit regions, number of times of repetition and repetition interval of a repetitive pattern segment region. For example, referring to FIG. 6, 50 denotes one unit region (also referred to as a pattern segment repetition frame), which is defined by the repetition interval ($P_x$, $P_y$) and is determined so as to exclude a portion of each of the pattern elements at ends of adjacent repetitive pattern segments to eliminate partial overlap between the adjacent repetitive pattern segments included in adjacent memory cells (unit cells) 130 (see step 8-5 in FIG. 8). Accordingly, an array of repetitive pattern segments in the memory array may be considered as an aggregation of unit regions (pattern segment repetition frames) 50 such as shown in FIG. 7, in which continuity or connection between adjacent unit regions (pattern segment repetition frames) 50 is held without any overlap. Such unit region (pattern segment repetition frame) 50 may be determined, for example, on the basis of respective repetition periods (hereafter, referred to as "pitches") in two orthogonal directions (called X-direction and Y-direction) of identical (rectangular) pattern elements in the repetitive pattern segments. For example, in FIG. 6, it may be determined such that length $P_x$ in X-direction of the unit region (pattern element repetition frame) 50 is equal to the period in X-direction of identical pattern elements in the repetitive pattern segments included in adjacent memory cells (unit cells) 130 and length $P_y$ in Y-direction of the unit region (pattern segment repetition frame) is equal to the period in Y-direction of identical pattern elements in the repetitive pattern segments included in adjacent memory cells (unit cells) 130.

② Representative to-be-processed pattern segment data producing unit

In many cases, some particular portions of the design pattern data will be later subjected to changes of magnification, mirror inversion, overlap removal and/or pattern size correction. Thus, it is necessary to hold or maintain the connection or continuity between pattern segments contained in adjacent unit regions without any overlap therebetween even when the above-mentioned pattern processing (changes of magnification, mirror inversion, etc.) are applied to the pattern data in a later stage.

To this end, a representative to-be-processed repetitive pattern segment data is produced by selecting, among the pattern data in the design pattern data, a pattern data for one of the unit regions (pattern element repetition frames) 50 and pattern data for other unit regions adjacent thereto, for example, pattern data for m columns × n rows (m and n being positive integers) of unit regions surrounding the one unit region and developing them (e.g., on a work memory of a computer), on the basis of the repetition information for defining the pattern segment repetition frame 50. The pattern segment included in the one unit region (pattern segment repetition frame) 50 which is obtained as described above can represent the pattern segments in another repetition frame 50 unless the respective unit cells are affected by the non-repetition section.

③ Pattern processing unit/fundamental pattern segment data producing unit

Overlap removal and size correction of pattern elements are applied to the representative to-be-processed repetitive pattern segment data for the array data sections 31 and pattern data for the non-repetition data section 32 which are obtained in the unit 41. The pattern data having been subjected to the above-mentioned pattern processing is then subjected to proximity correction (correction for suppressing degradation of drawing precision due to scatterning of the electron beam in an electron beam exposure apparatus at the time of pattern drawing) to provide processed repetitive pattern segment data and processed non-repetition data section. The above-mentioned pattern processing and proximity correction may be effected with any known art. See, in this respect, Proc. IEDM, Dec. 1983, pp. 558–561 and Proc. 18th Design Automation Conference, June 1981, pp. 563–570, respectively.

Among the processed pattern data, the pattern data for the above-mentioned one unit region, i.e., for the central unit region is extracted from the representative repetitive pattern segment data having been processed. The pattern data for the thus extracted central unit region now corresponds to that portion of the processed repetitive pattern segment data which lies within the pattern segment repetition frame and constitutes a fundamental pattern segment data.

Figure 9:
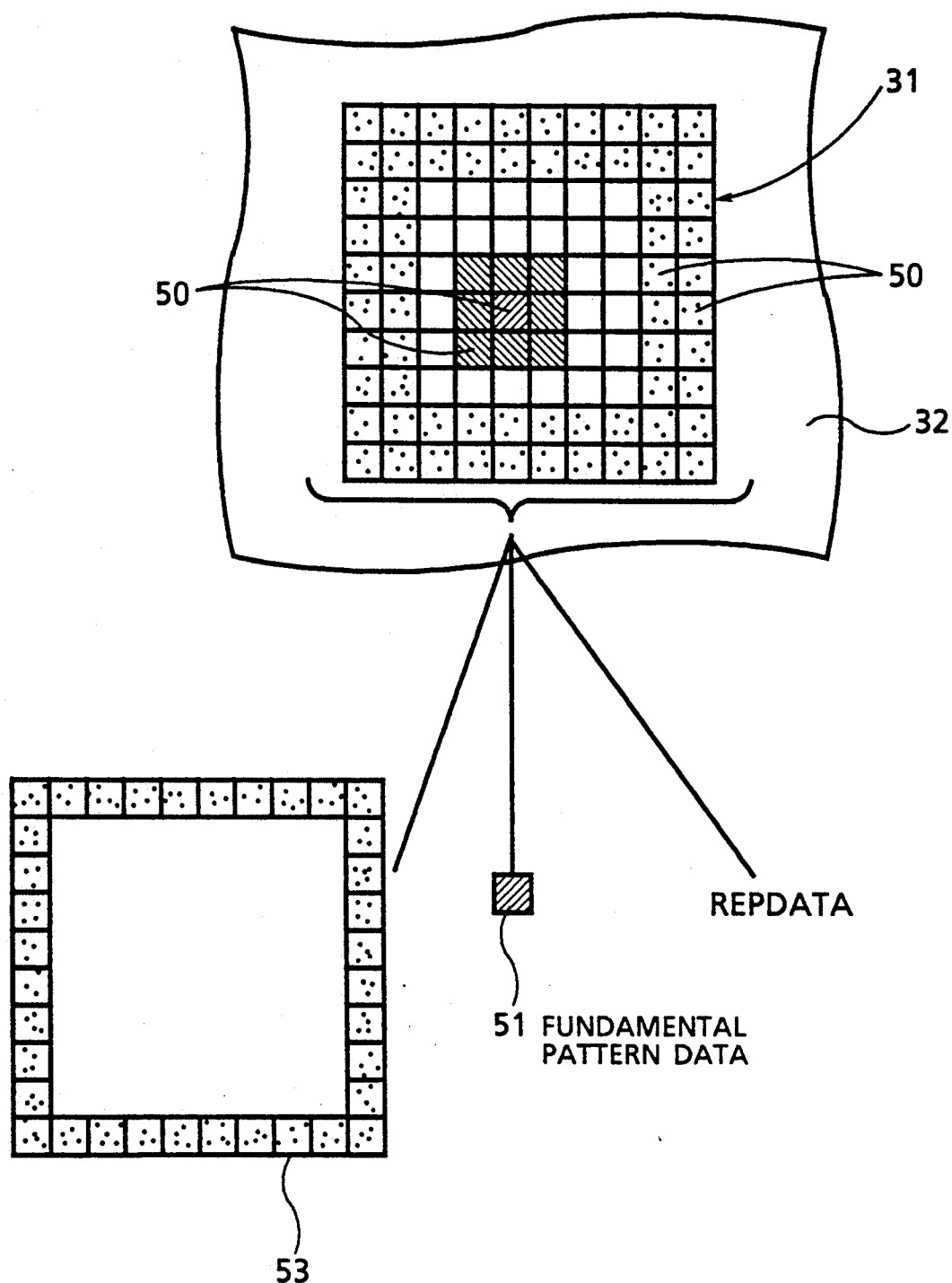
FIG. 9 is an explanatory view showing an example of a technique for compressing a data to be converted to an exposure data according to an embodiment of the present invention.

As a result, the data corresponding to the repetitive pattern segments defined by a large number of data cells 50 included in the central portion of the array section (repetition data section) 31, is shown in FIG. 9.

Figure 10:
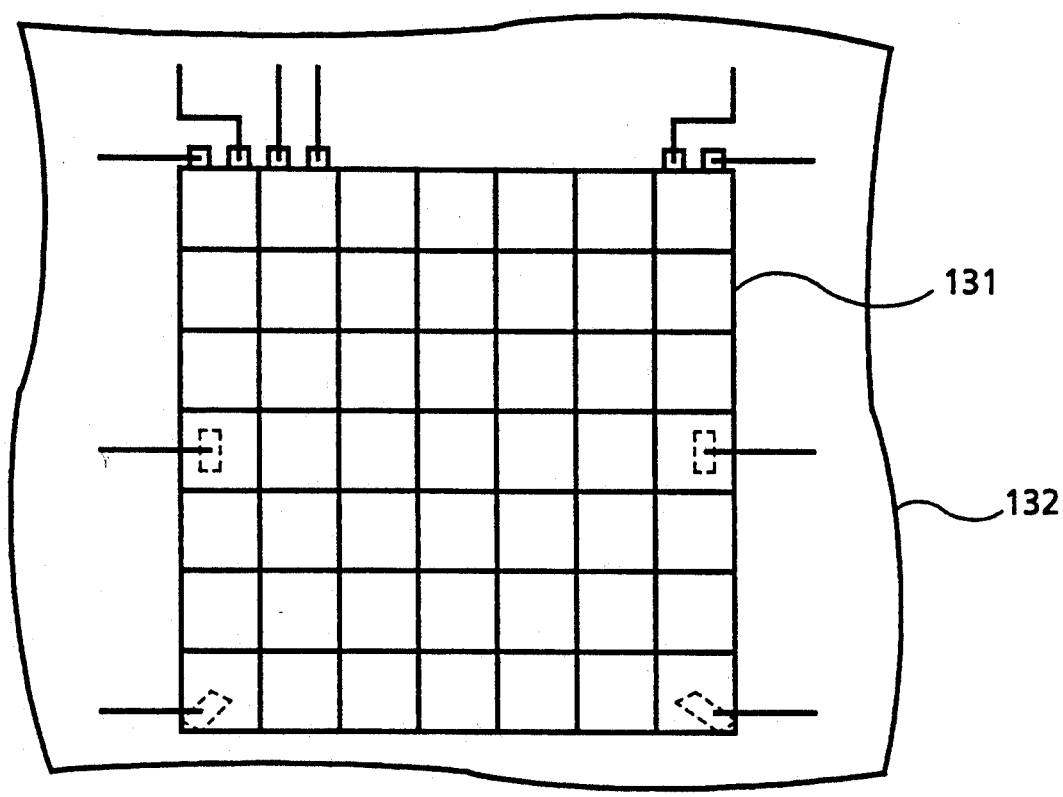
FIG. 10 is an explanatory view of an example of a relationship between an outer peripheral portion of an array section and a non-repetition section.

As illustrated in FIG. 10, it is probable that the outer peripheral portion of the array section 131 is individualized depending on connecting conditions with patterns included in the non-repetition section 132, it may be impossible to specify pattern data for the outer peripheral portion of the array section by the fundamental pattern data 51. The extent of such an outer peripheral portion is determined depending on the extent of or how far the patterns of the non-repetition section 132 come into the array sections 131 for connection. FIG. 9 shows an example a pattern data, in which the patterns for the non-repetition section 132 defined by the non-repetition data section 32 do not come into the array section beyond one and more pattern segment repetition frames (unit regions) 50 only on the outermost peripheral portion of the array section 131 defined by the array data section 131. In this case, since the pattern segments within the pattern segment repetition frames for the outermost peripheral portion of the array section affect pattern segments within pattern segment repetition frames inwardly adjacent thereto, pattern data within the repetition frame on the outermost peripheral portion of the array section are determined taking into consideration the state of extension of patterns at the boundary between the non-repetition data section and repetition frames adjacent thereto and the areas of the unit cells defined by the cell data. (See step 8-7 in FIG. 8).

Thus, as show in FIG. 9, the pattern data which defines the array section 131 includes pattern data 53 on the outermost periphery (this data may be treated as a part of data for the non-repetition section 132), fundamental pattern segment data 51 and repetition information REPDATA. With this, data compression of input design pattern data is performed before generation of exposure data.

④ EB exposure data producing unit

The pattern data provided by the unit 42 is subjected to a data format conversion, etc. including decomposition of the resulting data into exposure pattern units (trapezoidal pattern units) each being an exposure unit of an electron beam exposure apparatus 2. The exposure data thus obtained has been produced based on the pattern data compressed before exposure data are generated, and the exposure data itself has also been compressed with respect to the repetitive pattern portion. Namely, the exposure data corresponding to the repetition pattern segments may be stored in a memory of the electron beam exposure apparatus, so that the exposure data is read out of the memory so as to be provided for exposure processing in drawing the relevant pattern segments.

Next, another example of data compression processing (production of repetition information and production of fundamental pattern segment data) for the array section will be explained with reference to FIGS. 11A and 11B.

Figure 11A:
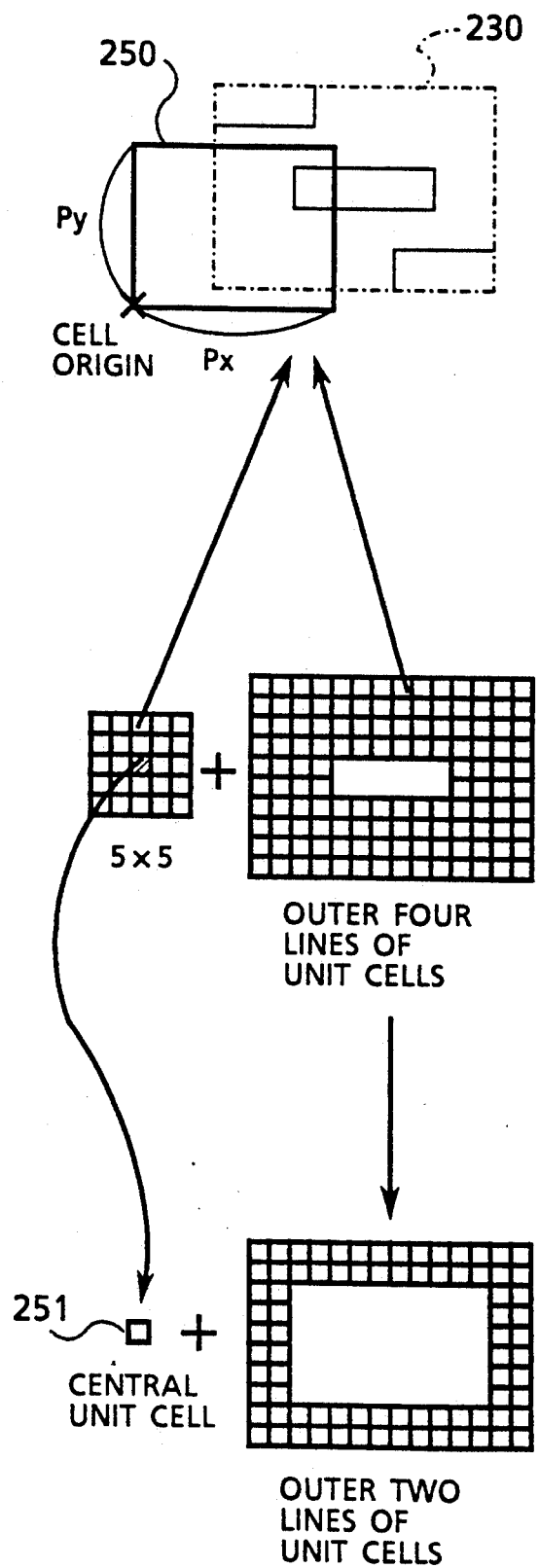

In FIGS. 11A and 11B showing another embodiment, a repetition frame 250 is set with dimensions $P_x$ and $P_y$ in X- and Y-directions corresponding to repetition intervals for unit cells in orthogonal directions, respectively, with an origin of the coordinate system which specifies the layout of a unit cell 230 determined at a lower left point in the figure. In this case, the repetitive pattern segment included in the unit cell may exist sometimes in a region which is apart from the repetition frame by $P_x$ and/or $P_y$ in X-direction and/or Y-direction, and it is also necessary to consider the connecting relationship between a unit cell and those unit cells which surround the one unit cell.

FIG. 11B is a simplified diagram which exclusively shows X-direction components of the unit cells and the pattern segment repetition frame. Rectangles represent regions where pattern elements contained in unit cells exist, while the distance between two vertical lines FR 11 and FR 12 represent an X-direction length of the repetition frame. The repetition frame contains not only a pattern for one unit cell with which the frame is mainly concerned, but also portions of patterns of two lines of unit cells (on each of the left-hand and right-hand sides in FIG. 11B) surrounding the one unit cell. For the purpose of obtaining a fundamental pattern, data for five lines of unit cells (more accurately, data for 5 lines×5 lines of unit cells, since the above explanation is applicable to the Y-direction) is developed so that the resulting developed data will be a representative to-be-processed data. After the representative to-be-processed data is pattern-processed, data is selected from the data for the central unit cell through the repetition frame. This selected data will be a fundamental pattern data.

As for the outer peripheral portion of the array section, it can be seen from FIG. 11B that the outermost two lines of unit cells are different from unit cells in the central portion of the array section in the number of overlapping unit cells (the overlapping state). Therefore, it is impossible to data compress the outermost two lines of unit cells of the array section. Furthermore the outermost two lines of unit cells contain portions of patterns of the outermost four lines of unit cells. Therefore, by taking the state of connection between two lines of unit cells on the outer periphery of the array section and the inside thereof into consideration, data for circumferential patterns included in four lines of unit cells on the outer periphery of the array section is developed, and is combined with data for patterns for outside the array section. The combined data are subjected to a pattern processing and those pattern processed data excluding inside two of the four lines of unit cells on the outer periphery are made to be what should be data compressed. With this, the region where data compression is possible in the array section will be that portion of the array section excluding two lines of unit cells on the outer periphery of the array section.

Figure 12A:
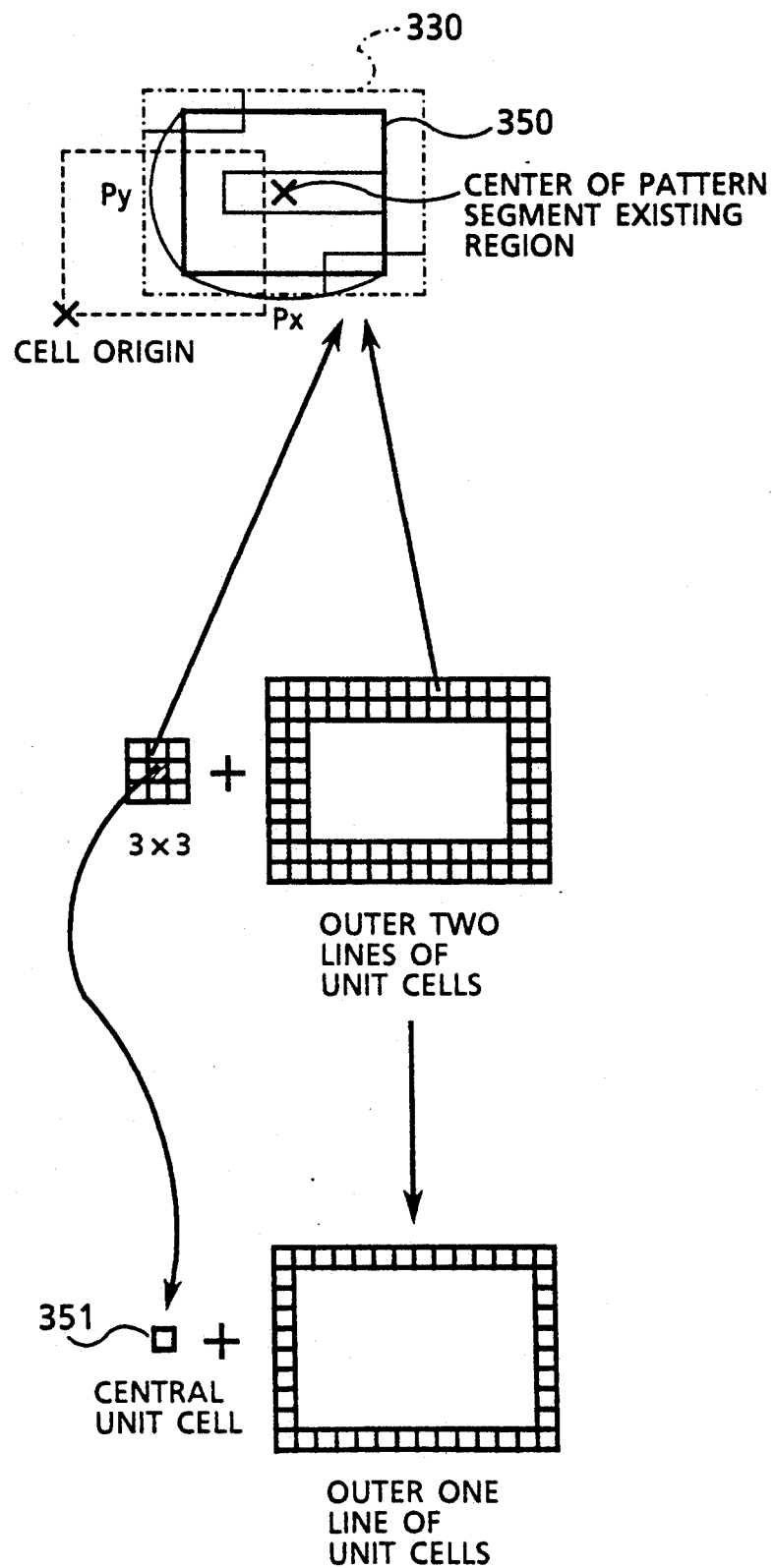
FIGS. 12A and 12B are views showing still another embodiment of the present invention.
Figure 12B:
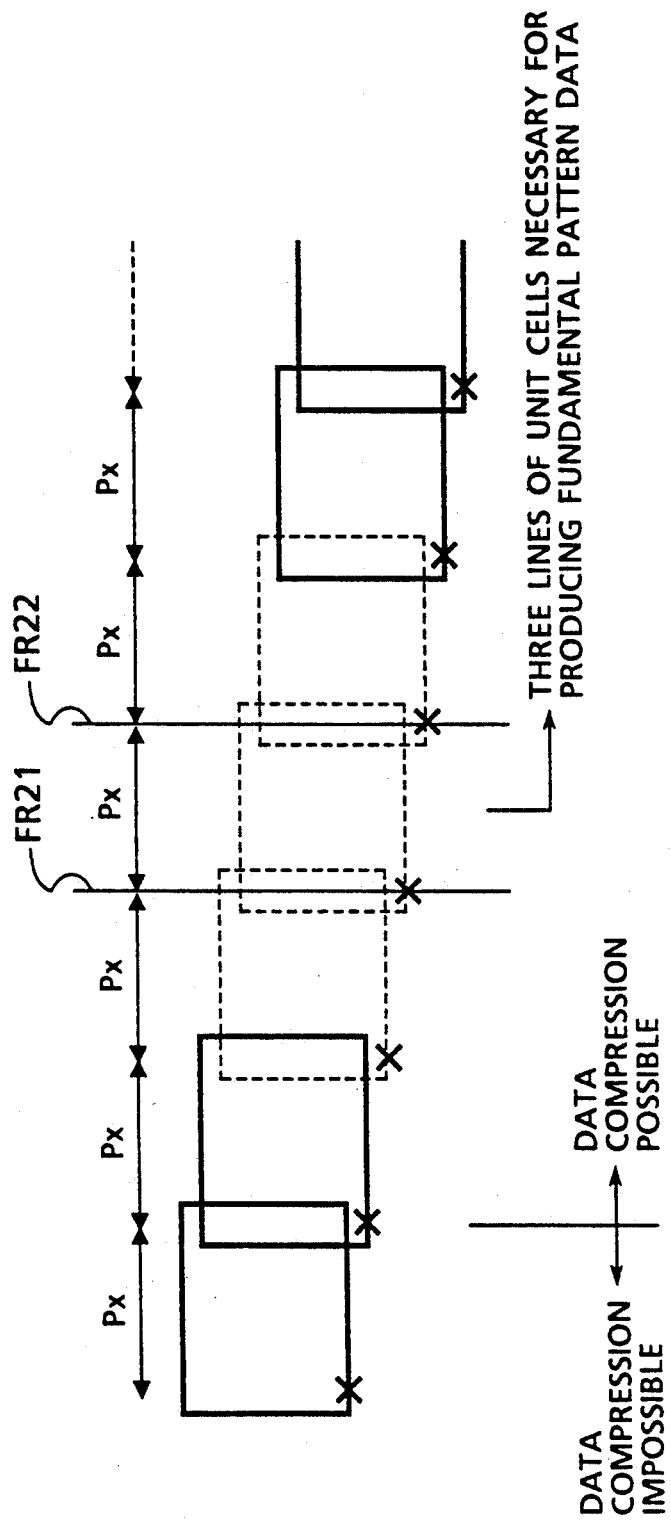

In FIGS. 12A and 12B show another embodiment, where a region within the array section that can be data compressed is further extended. Namely, a region within a unit cell 330 where a pattern segment exists is determined, and a pattern segment repetition frame 350 is determined at distances $P_x/2$ and $P_y/2$ in X-direction and Y-direction from the center of the pattern segment existing region. In this case, as can be seen from FIG. 12B which exclusively shows X-direction components of the unit cells and the pattern segment repetition frame similar to FIG. 11B, the repetition frame whose X-direction length is a distance between two vertical lines FR 21 and FR 22 contains not only a pattern for one unit cell with which the frame is mainly concerned, but also portions of patterns of one line of unit cells (on each of the left-hand and right-hand sides in FIG. 12B) surrounding the one unit cell. For the purpose of obtaining a fundamental pattern, data for three lines of unit cells (more accurately, data for 3 lines×3 lines of unit cells, since the above explanation is applicable to the Y-direction) is developed so that the resulting developed data will be a representative to-be-processed data. After the representative to-be-processed data is pattern-processed, data is selected from the data for the central unit cell through the repetition frame. This selected data will be a fundamental pattern data.

As for the outer peripheral portion of the array section, it can be seen from FIG. 12B that the outermost one line of unit cells are different from unit cells in the central portion of the array section in the number of overlapping unit cells (the overlapping state). Therefore, it is impossible to data compress the outermost one line of unit cells of the array section. Furthermore, the outermost one line of unit cells contain portions of patterns of outermost two lines of unit cells. Therefore, by taking connection between one line of unit cells in the peripheral portion of the array section and the inside thereof, data for two lines of unit cells in the peripheral portion of the array section are developed and combined with data for patterns for outside the array section. The combined data are subjected to a pattern processing and those pattern processed data excluding inside of two lines of unit cells on the outer periphery are made to be what should be data compressed. With this, the region where data compression is possible in the array section will be that portion of the array section excluding the outer peripheral one line of unit cells.

Next, another example of data compression with respect to an outer peripheral portion of the above-mentioned array section will be explained.

In the above description, data defining the peripheral portion of the array section which should be subjected to conversion to exposure data is determined by developing data for the whole pattern elements and combining the developed data with data for pattern elements outside or within the array section. In the present embodiment, however, an identical partial pattern segment which is common to respective unit cells is selected based on the design pattern data and the information showing state of intrusion of an outside pattern elements.

Figure 13:
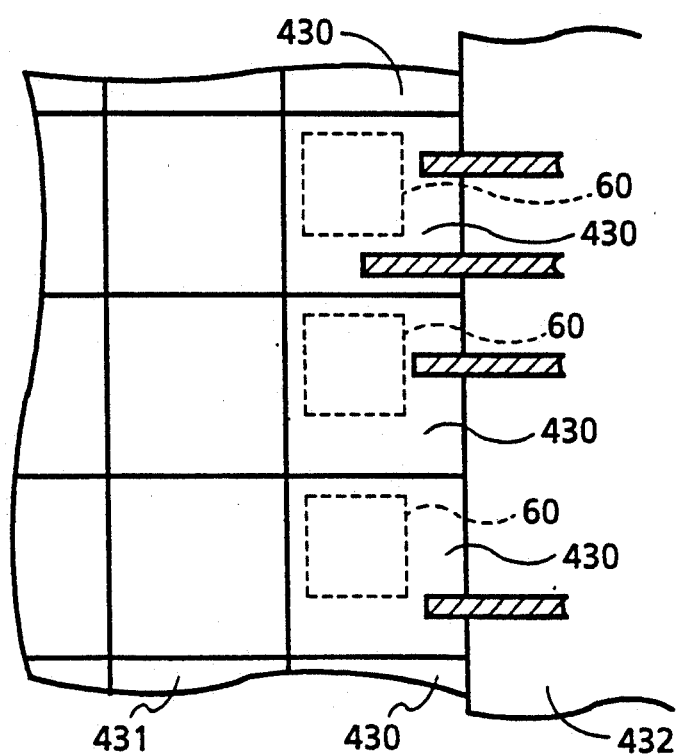
FIG. 13 is an explanatory view in which identical pattern segments are observed in an outer peripheral portion of an array section in another embodiment of the present invention.

Referring to FIG. 13 showing unit cells 430 arranged in the outer peripheral portion of the array section 431 and adjoined to the non-repetition section 430, are identical partial pattern segments 60, which do not interfere with pattern elements extending from the non-repetition section at random. Information on intruding or extending pattern elements from the outside, which is necessary for recognizing the identical partial pattern segment 60, may be given separately from the design pattern data, or such an information as to designate the range of pattern elements which intrude from the outside into respective repetitive pattern segments may be attached in advance to the design pattern data along with the coordinate information of the repetitive pattern segments. The identical partial pattern segment 60 is recognized with such an additional information and repetitive pattern segments for unit cells, and the recognition is given by an arrangement information of a repetition frame which defines the range of the identical partial pattern segment 60. Local fundamental pattern segment data are produced through necessary pattern processing similar to the one described above for this pattern segment repetition frame. It becomes thus possible to carry out data compression of data included in the outer peripheral portion of the array section by utilizing the local fundamental pattern segment data which is common to respective unit cells.

Besides, such a technique is also applicable to the non-repetition section 432.

The following functional effects are obtainable according to the above-mentioned embodiments.

(1) Repetitive pattern segments defined by the array data sections in a design pattern data and arranged regularly are recognized, a pattern segment repetition frame is determined on the basis of that recognition such that any partial overlap between mutual repetitive pattern segments are removed, repetition information concerning the pattern elements is acquired, data for one unit cell and data for a required number of unit cells surrounding the one unit cell are developed, the developed data is subjected to a pattern processing, and a fundamental pattern segment data is produced by the use of a pattern segment data at the above-mentioned one unit cell at the central portion. As for the outer peripheral portion of the array section, the data for the whole patterns in the peripheral portion are developed and subjected to a required pattern processing with intrusion of pattern elements from the outside and connecting state with the inside unit cells taken into consideration, thereby to determine data to be subjected to conversion to exposure data in the outer peripheral region of the array section. Accordingly, it is possible to carry out data compression such that data to be subjected to conversion to exposure data which specify the array section in the input design pattern data is reduced to a combination of data for the outer peripheral portion of the array section, fundamental pattern segment data produced from data contained in one repetition frame, and repetition information REPDATA of the repetition frame.

(2) Owing to the above-mentioned effect (1), it is possible to reduce the amount of data to be converted to exposure data, and furthermore, to reduce the exposure data amount. For example, the data amount could be reduced to approximately half of a conventional one for 1M bit DRAM.

(3) Owing to the above-mentioned effect (1), since data to be converted to exposure data is compressed, it is possible to reduce computer processing time for data transfer and arithmetic processing required for conversion processing into exposure data. For example, the computer processing time could be reduced to half of a conventional one or less.

(4) Identical pattern segments which are locally provided or exist at unequal intervals in the outer peripheral portion of the array section or in the non-repetition section are recognized to produce a local fundamental pattern segment data, and a processing of compression of data to be subjected to conversion to exposure data is effected based on the local fundamental pattern segment data and repetition information thereof. As a result, it is possible to obtain exposure data still more efficiently and with less data amount as compared with a case in which data to be converted to exposure data are obtained by developing data for all the pattern elements of the outer peripheral portion of the array section and the non-repetition section.

The invention has been specifically described above with reference to some embodiments. However, the present invention is not limited to those embodiments, but it is needless to say that various changes and modifications may be made without departing from the spirit or scope of the invention.

For example, a pattern for polysilicon gates which are to be included in a memory cell is shown in the above embodiment as a specific example of a repetitive pattern segment. However, the present invention is not limited thereto, but may be applied in a similar manner to pattern production for various masks that are required in a manufacturing process of a semiconductor integrated circuit device such as an aluminum wiring layer and a diffusion layer. Further, the data format of the design pattern data is not limited to what is described in the above-mentioned embodiments, but may be modified appropriately.

While a case in which the invention is applied to formation of a mask pattern of an LSI memory such as a DRAM which is in an industrial field of the background of the invention has been explained in the above description. However, the present invention is not limited to this case, but is widely applicable to formation of mask pattern data for a semiconductor integrated circuit device such as one-chip microcomputers and other peripheral controllers including RAMs, ROMs and so on. Moreover, the present invention may be applied not only to a semiconductor integrated circuit device, but also to generation of electron beam exposure data that requires predetermined pattern segments such as a wiring substrate.

While a preferred embodiment has been set forth with specific details, further embodiments, modifications and variations are contemplated according to the broader aspects of the present invention, all as determined by the spirit and scope of the following claims.

I claim:

1. A method of generating an exposure data for an exposure apparatus from a circuit design pattern data including at least data for defining repetitive pattern segments, comprising:
   producing repetition information which defines a plurality of unit regions, respectively having the repetitive pattern segments, without any overlap between adjacent unit regions, in a repetition region including the repetitive pattern segments in the circuit design pattern data;
   producing fundamental pattern segment data which defines one of the repetitive pattern segments for one of the unit regions, on the basis of the repetition information, while holding continuous regularity of the repetitive pattern segments in the unit regions; and
   producing the exposure data for the repetition region including the repetitive pattern segments, on the basis of the fundamental pattern segment data and repetition information.

2. The method of claim 1, further including:
   producing outer peripheral pattern segment data for unit regions in an outer peripheral portion of a region defined by the repetition information while maintaining continuous regularity of the repetitive pattern segments in consideration of connection with internal and external unit regions; and
   said producing the exposure data further being on the basis of the outer peripheral pattern segment data.

3. A method according to claim 1, wherein said step of producing the exposure data includes performing overlap removal, pattern correction and the like of the fundamental pattern segment data while maintaining continuous regularity of the repetitive pattern segments included in the unit regions.

4. A method of generating an exposure data for an exposure apparatus from a circuit design pattern data, comprising:
   recognizing identical pattern segments appearing in the circuit design pattern data and producing information concerning arrangement of unit regions including the identical pattern segments;
   producing a local fundamental pattern segments data for one of the unit regions on the basis of the information in consideration of connection of the one of the unit regions with its circumferential patterns; and
   generating the exposure data corresponding to the identical pattern segments, on the basis of the local fundamental pattern segment data and the information.

5. A method according to claim 4, wherein said generating step includes performing overlap removal and pattern correction on the identical pattern elements defined by the local fundamental pattern segment data while maintaining regular connection relationship between the identical pattern segments and their circumferential patterns.

6. A method according to claim 5, including generating the exposure data for a non-repetition section defined in the design pattern data.

7. A method of converting a design pattern data for a semiconductor integrated circuit device to an exposure data for drawing a pattern with an exposure apparatus, the pattern including a repetition section divided into a plurality of regularly arranged unit cells and non-repetition section adjoining the repetition section, the design pattern data including a repetition data section corresponding to the repetition section of the pattern and defining at least one repetitive pattern segment for the unit cells with an overlap between adjacent ones of repetitive pattern segments and a non-repetition data section corresponding to the non-repetition section of the pattern, the method comprising the steps of:
   producing repetition information from the design pattern data, the repetition information specifying the at least one repetitive pattern segment;
   determining a pattern segment repetition frame on the basis of the repetition information, the pattern segment repetition frame defining a unit region selected from the repetitive pattern segment, a repetitive arrangement of the unit region without any overlap between adjacent ones of the unit regions being equivalent to at least a portion of the repetition section of the pattern defined by the repetition data section;
   producing a to-be-processed repetitive pattern segment data by selecting data for one of the unit cells and at least those of the unit cells which are adjacent the one of the unit cells and developing to-be-processed repetitive pattern segment data for one of the unit cells and adjacent unit cells on the basis of the repetition information;
   subjecting the to-be-processed repetitive pattern segment data and the non-repetitive data section to a pattern processing operation to produce processed repetitive pattern segment data and a processed non-repetitive data section;
   extracting that portion of the processed repetitive pattern segment data for the one of the unit cells among the processed repetitive pattern segment data which lies within the pattern segment repetition frame and forming a fundamental pattern segment data therefrom; and
   storing in a memory the fundamental pattern segment data for a repetitive use for drawing the repetition section of the pattern and the processed non-repetition data section for drawing the non-repetition section of the pattern.

8. A method according to claim 7, wherein said producing repetition information includes producing positional information of the unit regions, a number of times of repetition of the unit regions and a repetition interval between the unit region.

9. A method according to claim 7, wherein the unit cells are arranged two-dimensionally and the method further comprises a step of transferring a portion of the design pattern data for an outer portion of the repetition section to the non-repetition pattern section when there exists a pattern element extending over a boundary between the repetition section and the non-repetition section of the pattern so that the fundamental pattern segment data is not used for drawing the outer portion of the repetition section.

10. An apparatus for converting a design pattern data for a semiconductor integrated circuit device to an exposure data for drawing a pattern with an exposure apparatus, the pattern including a repetition section divided into a plurality of regularly arranged unit cells and non-repetition section adjoining the repetition section, the design pattern data including a repetition data section corresponding to the repetition section of the pattern and defining repetitive pattern segments for the unit cells with an overlap between adjacent ones of the repetitive pattern segments, and a non-repetition data section corresponding to the non-repetition section of the pattern, the apparatus comprising:

first means for producing, from the design pattern data, repetition information specifying at least one of the repetitive pattern segments;

said first means further producing, from the repetition information, a pattern segment repetition frame defining a unit region selected from the repetitive pattern segment, so that a repetitive arrangement of the unit regions is without any overlap between adjacent ones of the unit regions being equivalent to at least a portion of the repetition section of the pattern defined by the repetition data section;

second means coupled to said first means for producing a to-be-processed repetitive pattern segment data by selecting data for one of the unit cells and at least those of the unit cells which are adjacent the one of the unit cells and developing the to-be-processed repetitive pattern segment data for the one of the unit cells and the at least those of the unit cells which are adjacent the one of the unit cells on the basis of the repetition information;

third means coupled to said second means for pattern-processing the to-be-processed repetitive pattern segment data and the non-repetition data section to produce processed repetitive pattern segment data and a processed non-repetition data section;

fourth means coupled to said third means for extracting that portion of the processed repetitive pattern segment data for the one of the unit cells among a portion of the processed repetitive pattern segment data which lies within the pattern segment repetition frame and forming a fundamental pattern segment data therefrom; and a memory for storing the fundamental pattern segment data for a repetitive use for drawing the repetition section of the pattern and for storing the processed non-repetition data section for drawing the non-repetition section of the pattern.

11. A method for the conversion of a design pattern data that defines a pattern to exposure data without undesirable pattern missing or discontinuity or overlap, comprising:

determining whether two or more identical repetitive patterns exist in the design pattern data;

in response to said determining, generating repetition information as to the arrangement, number of repetitions, coordinates and interval of identical unit regions without overlap between adjacent unit regions so that each unit region is including in a repetitive pattern segment;

generating fundamental pattern segment data by processing part of the design pattern data that defines a single one of the unit regions to correct size and remove overlap;

from the design pattern data, developing non-repetition pattern data excluding all of the part of the design pattern data for all of the unit regions while holding continuous regularity of the unit regions, as defined by the repetition information and the fundamental pattern segment data, with a non-repetition pattern, as defined by the non-repetition pattern data; and producing exposure data on the basis of the fundamental pattern segment data, the repetition information, and the non-repetition pattern data.

12. A method according to claim 11, further including:

drawing the pattern on an electronic device substrate by moving a beam of exposure apparatus in accordance with the exposure data.

* * * * *